United States Patent
Fujihara et al.

(10) Patent No.: US 10,920,017 B2
(45) Date of Patent: Feb. 16, 2021

(54) POLYIMIDE RESIN AND RESIN COMPOSITION

(71) Applicant: KANEKA CORPORATION, Osaka (JP)

(72) Inventors: Kan Fujihara, Otsu (JP); Atsushi Kumasaki, Otsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/307,684

(22) PCT Filed: Jul. 28, 2017

(86) PCT No.: PCT/JP2017/027555
§ 371 (c)(1),
(2) Date: Dec. 6, 2018

(87) PCT Pub. No.: WO2018/021565
PCT Pub. Date: Feb. 1, 2018

(65) Prior Publication Data
US 2019/0263968 A1   Aug. 29, 2019

(30) Foreign Application Priority Data

Jul. 29, 2016 (JP) ................ 2016-149289

(51) Int. Cl.
| | |
|---|---|
| C08G 73/10 | (2006.01) |
| C08L 79/08 | (2006.01) |
| G03F 7/023 | (2006.01) |
| G03F 7/039 | (2006.01) |
| C08L 61/06 | (2006.01) |
| C08L 63/00 | (2006.01) |
| C08K 5/29 | (2006.01) |
| C08K 5/13 | (2006.01) |
| C08K 5/3445 | (2006.01) |
| H05K 3/28 | (2006.01) |

(52) U.S. Cl.
CPC ....... *C08G 73/106* (2013.01); *C08G 73/1039* (2013.01); *C08G 73/1042* (2013.01); *C08G 73/1046* (2013.01); *C08K 5/13* (2013.01); *C08K 5/29* (2013.01); *C08K 5/3445* (2013.01); *C08L 61/06* (2013.01); *C08L 63/00* (2013.01); *C08L 79/08* (2013.01); *G03F 7/023* (2013.01); *G03F 7/0236* (2013.01); *G03F 7/039* (2013.01); *H05K 3/28* (2013.01)

(58) Field of Classification Search
CPC ... C08L 79/08; C08G 73/1042; C08G 73/106; C08G 73/10; C09J 179/08
See application file for complete search history.

(56) References Cited

U.S. PATENT DOCUMENTS

| | | | |
|---|---|---|---|
| 2006/0069227 A1* | 3/2006 | Sugo | C08G 73/00 528/170 |
| 2006/0199920 A1 | 9/2006 | Okada et al. | |
| 2010/0056730 A1* | 3/2010 | Yoneda | C08G 73/106 525/408 |
| 2012/0157574 A1* | 6/2012 | Takasaki | C08L 83/10 523/435 |
| 2017/0334837 A1 | 11/2017 | Komori et al. | |

FOREIGN PATENT DOCUMENTS

| | | |
|---|---|---|
| JP | 2004-35650 A | 2/2004 |
| JP | 2004-94118 A | 3/2004 |
| JP | 2004-212678 A | 7/2004 |
| JP | 2004-317725 A | 11/2004 |
| JP | 2015-64484 A | 4/2015 |
| KR | 10-2015-0135824 A | 12/2015 |
| WO | WO 2016/158674 A1 | 10/2016 |

OTHER PUBLICATIONS

International Preliminary Report on Patentability and Written Opinion dated Feb. 7, 2019 in PCT/JP2017/027555 (English Translation only), 9 pages.
International Search Report dated Oct. 10, 2017 in PCT/JP2017/027555 filed on Jul. 28, 2017.

* cited by examiner

*Primary Examiner* — Gregory Listvoyb
(74) *Attorney, Agent, or Firm* — Oblon, McClelland, Maier & Neustadt, L.L.P.

(57) ABSTRACT

A polyimide resin of the present invention contains a repeating unit represented by the formula (1). $X_1$ is a tetravalent organic group having at least one ring structure, and each two of four carbonyl groups bonded to $X_1$ form a pair and, together with $X_1$ and a nitrogen atom, form a five-membered ring. $R_2$ is a hydrogen, an alkyl group having 1-9 carbon atoms, or an alkoxy group having 1-10 carbon atoms. Y is a divalent organic group having a phenolic hydroxyl group. The polyimide resin of the present invention can be practically used as a thermosetting resin composition or a positive type photosensitive resin composition.

(1)

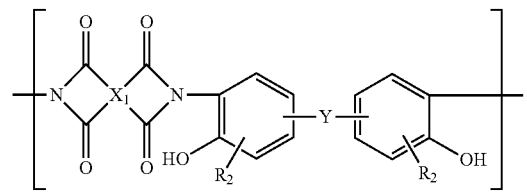

7 Claims, 3 Drawing Sheets

[Figure 1]
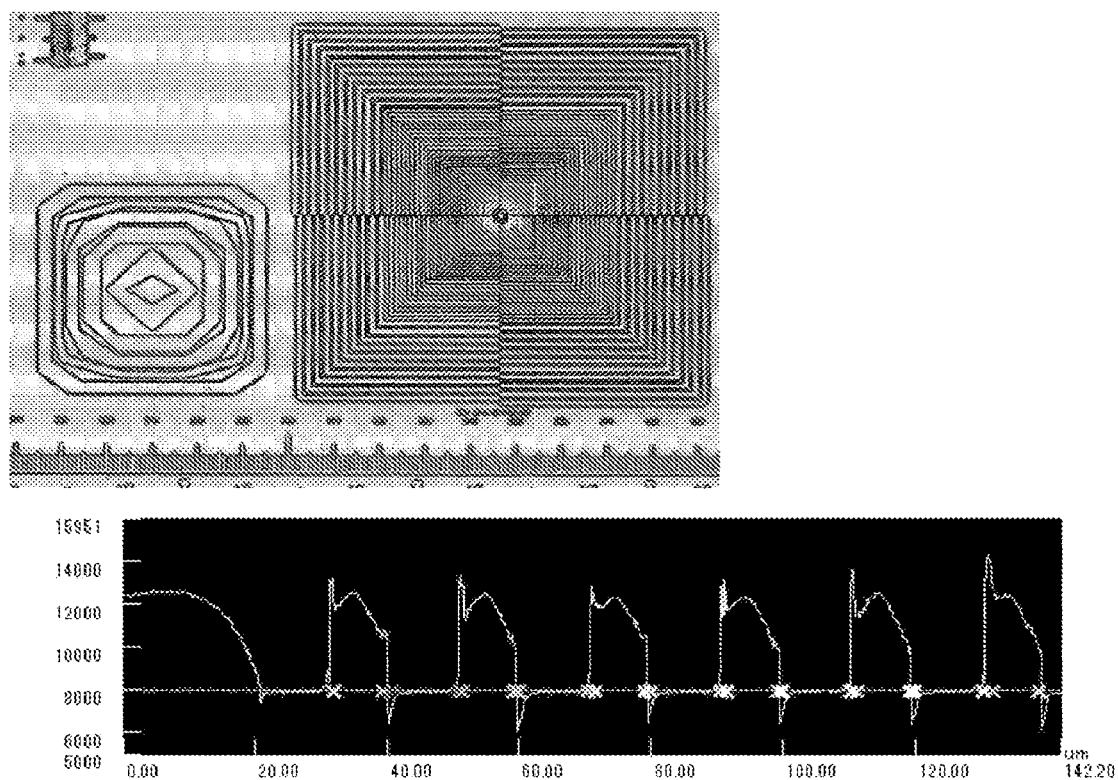

[Figure 2]
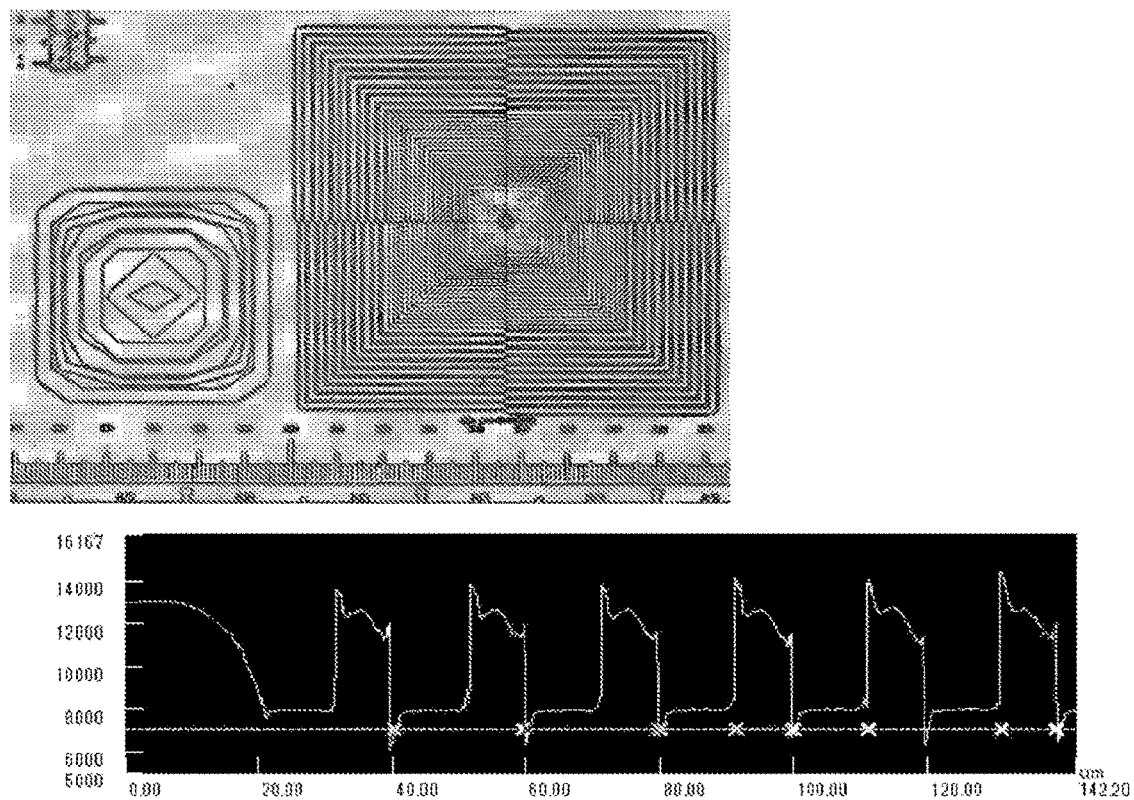

[Figure 3]
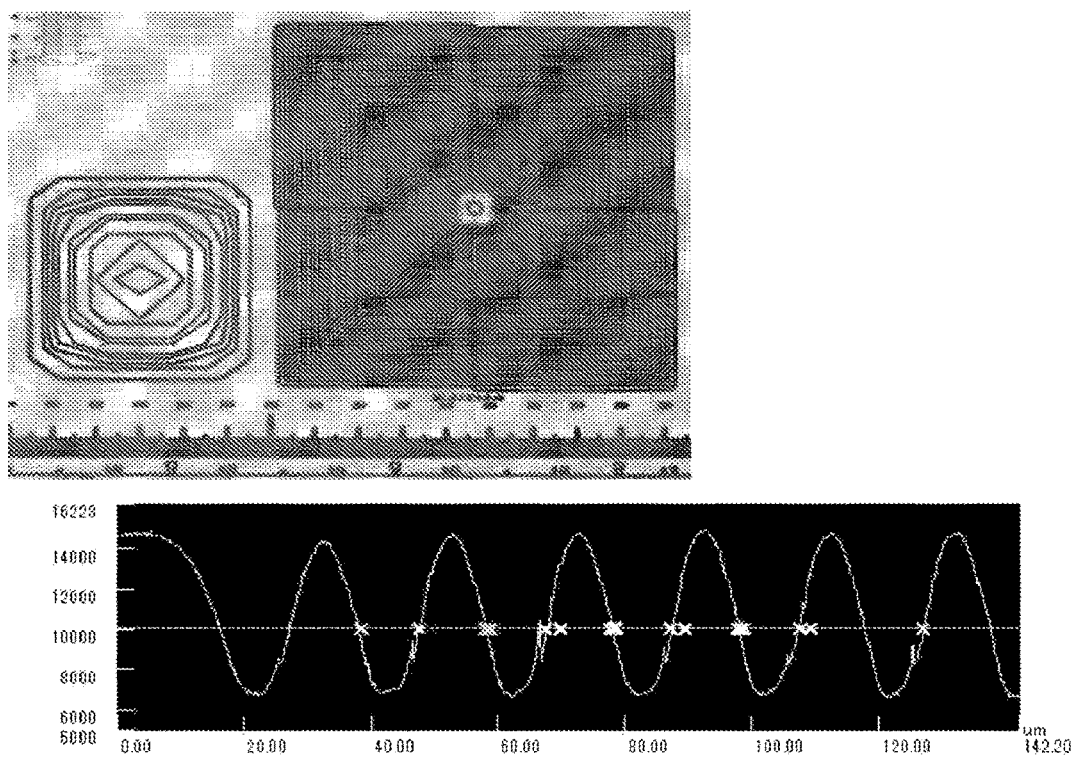

POLYIMIDE RESIN AND RESIN COMPOSITION

TECHNICAL FIELD

The present invention relates to a polyimide resin and a resin composition containing the polyimide resin.

TECHNICAL BACKGROUND

A polyimide resin is excellent in heat resistance and electrical insulation, and thus has been used as an insulating coating material or the like for an insulating film of a solid state element, a passivation film, a semiconductor integrated circuit and a flexible wiring board. In general, a polyimide resin has a low solubility with respect to an organic solvent. However, it is known that a polyimide resin can be imparted with solubility with respect to an organic solvent by introducing thereinto a predetermined functional group.

For example, Patent Document 1 and Patent Document 2 disclose that a polyimide resin is imparted with solubility by introducing thereinto a repeating unit having a specific phenolic hydroxyl group. Patent Document 1 discloses a thermosetting resin composition containing the polyimide resin and an epoxy resin. Patent Document 2 discloses a positive type resin composition containing the polyimide resin and a photosensitizer.

RELATED ART

Patent Documents

Patent Document 1: Japanese Patent Laid-Open Publication No. 2004-35650.
Patent Document 2: Japanese Patent Laid-Open Publication No. 2004-94118.

SUMMARY OF THE INVENTION

Problems to be Solved by the Invention

A coating film formed using the resin composition disclosed in Patent Document 1 has a low curing density and there has been a problem that a crack occurs after a humidification test. The photosensitive resin composition disclosed in Patent Document 2 has a low alkali developability and there is room for improvement in resolution of fine patterns.

In view of the above, the present invention is intended to provide a polyimide resin and a resin composition, which are excellent in balance of physical properties such as solubility, adhesion to a substrate, durability, and alkali developability, and are suitably used for an insulating coating material of a conductor circuit pattern, a positive type resist material, and the like.

Means for Solving the Problems

A polyimide resin of the present invention contains a predetermined diamine component having multiple phenolic hydroxyl groups, and has a repeating unit represented by the following general formula (1). The polyimide resin of the present invention may further contain a repeating unit represented by the following general formula (2).

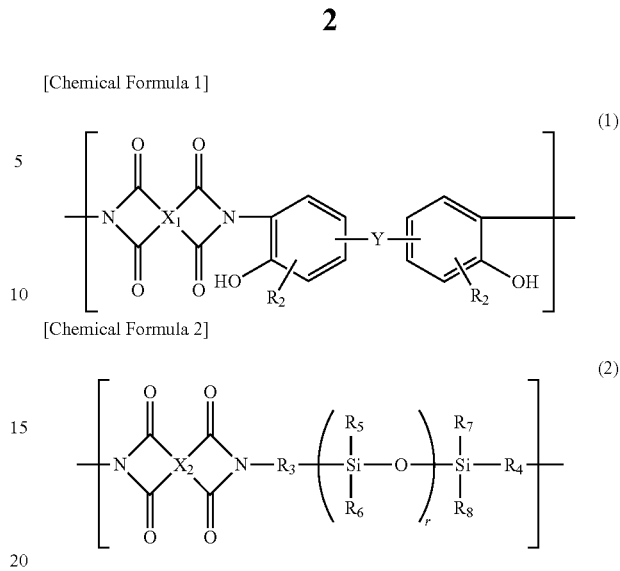

[Chemical Formula 1]

[Chemical Formula 2]

$X_1$ is a tetravalent organic group. Each two of four carbonyl groups bonded to $X_1$ form a pair and, together with $X_1$ and a nitrogen atom, form a five-membered ring. $X_2$ is a tetravalent organic group similar to $X_1$. $R_2$ is a hydrogen, an alkyl group having 1-9 carbon atoms, or an alkoxy group having 1-10 carbon atoms. Y is a divalent organic group having a phenolic hydroxyl group. $R_3$ and $R_4$ are each independently any divalent organic group, and preferably an alkylene group having 1-9 carbon atoms. $R_5$-$R_8$ are each independently an alkyl group having 1-9 carbon atoms, an alkoxy group having 1-10 carbon atoms, or a substituted or unsubstituted aryl group. r is an integer equal to or greater than 1.

The polyimide resin of the present invention preferably contains the repeating unit represented by the general formula (1) in an amount of 50-95 mol %. In the polyimide resin of the present invention, a total amount of the repeating unit represented by the general formula (1) and the repeating unit represented by the general formula (2) is preferably 55-100 mol %. The polyimide resin of the present invention may contain a repeating unit other than the repeating units represented by the general formula (1) and the general formula (2). A weight-average molecular weight of the polyimide resin of the present invention is preferably 3,000-150,000.

By mixing the above polyimide resin with other compounds, a thermosetting resin composition or a photosensitive resin composition can be prepared. The thermosetting resin composition contains the above polyimide resin and a thermosetting compound. As the thermosetting compound, an epoxy compound, a methylol compound, a methoxymethyl compound and the like are preferable. The photosensitive resin composition contains the above polyimide resin and a positive type photosensitizer. As the positive type photosensitizer, a naphthoquinone diazide compound is preferable. The photosensitive resin composition preferably further contains a thermosetting compound. The photosensitive resin composition preferably further contains a novolak resin.

Effect of Invention

The polyimide resin of the present invention has a high solubility with respect to an organic solvent, and is also excellent in compatibility with a thermosetting resin, a photosensitizer, and the like. A resin composition containing the polyimide resin of the present invention is excellent in heat resistance, adhesion to a substrate, and the like, and is suitably used as a thermosetting resin composition or a photosensitive resin composition.

BRIEF DESCRIPTION OF DRAWINGS

FIG. 1 illustrates an optical microscope image of a pattern after exposure and development of a resin composition of Example 4 and a cross-sectional shape measured using a laser microscope.

FIG. 2 illustrates an optical microscope image of a pattern after exposure and development of a resin composition of Example 5 and a cross-sectional shape measured using a laser microscope.

FIG. 3 illustrates an optical microscope image of a pattern after exposure and development of a resin composition of Comparative Example 1 and a cross-sectional shape measured using a laser microscope.

MODE FOR CARRYING OUT THE INVENTION

[Polyimide Resin]
(Structure of Polyimide)

A polyimide resin of the present invention contains a repeating unit represented by the following general formula (1).

[Chemical Formula 3]

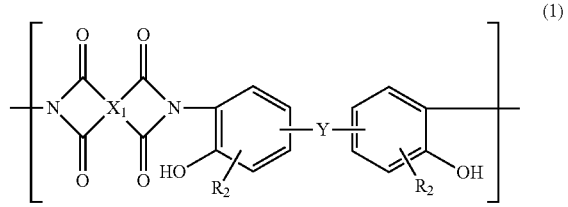

(1)

In the general formula (1), $X_1$ is a tetravalent organic group having at least one ring structure. $X_1$ is a residue of a tetracarboxylic acid dianhydride. Each two of four carbonyl groups bonded to $X_1$ form a pair, and two carbon atoms of one pair of carbonyl groups, together with $X_1$ and a nitrogen atom, form a five-membered ring. $R_2$ is a hydrogen, an alkyl group having 1-9 carbon atoms, or an alkoxy group having 1-10 carbon atoms. Y is a divalent organic group having a phenolic hydroxyl group.

A polyimide containing the repeating unit represented by the general formula (I) is obtained, for example, by subjecting a polyamide acid to dehydration ring closure, the polyamide acid being obtained by a reaction between a tetracarboxylic acid dianhydride represented the following general formula (1a) and a diamine represented by the following general formula (1 b).

[Chemical Formula 4]

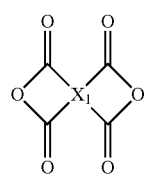

(1a)

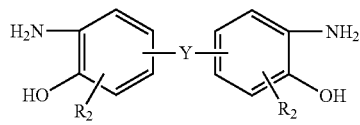

(1b)

$X_1$ which is a tetravalent organic group is a residue of the tetracarboxylic acid dianhydride represented by the general formula (1a). Examples of the tetracarboxylic acid dianhydride include various tetracarboxylic acid dianhydrides used in polyimide synthesis, and the tetracarboxylic acid dianhydride may be an aromatic compound or an alicyclic compound. In the aromatic tetracarboxylic acid dianhydride, four carbonyls may be bonded to one aromatic ring (monocyclic or condensed polycyclic ring), or two carbonyls may be bonded to each of different aromatic rings.

Examples of the alicyclic tetracarboxylic acid dianhydride include cyclobutane tetracarboxylic acid dianhydride, methylcyclobutane tetracarboxylic acid dianhydride, 1,2,3,4-tetracarboxybutane dianhydride, and the like. Examples of the aromatic tetracarboxylic acid dianhydrides in which four carbonyls are bonded to one aromatic ring include pyromellitic acid dianhydride, 1,2,5,6-naphthalene tetracarboxylic acid dianhydride, 2,3,6,7-naphthalene tetracarboxylic acid dianhydride and the like. Examples of the aromatic tetracarboxylic acid dianhydride in which two carbonyl groups are bonded to each of different aromatic rings include 2,2-bis[4-(3,4-dicarboxyphenoxy)phenyl]propane dianhydride, 2,2-bis[4-(3,4-dicarboxyphenoxy)phenyl]hexafluoropropane dianhydride, 2,2-bis(4-hydroxyphenyl) propane dibenzoate-3,3',4,4'-tetracarboxylic acid dianhydride, 3,3',4,4'-biphenyl tetracarboxylic acid dianhydride, 2,3,3',4'-biphenyl tetracarboxylic acid dianhydride, 4,4'-(hexafluoroisopropylidene)diphthalic acid anhydride, 3,3',4,4'-benzophenone tetracarboxylic acid dianhydride, 3,4'-oxydiphthalic acid anhydride, 4,4'-oxydiphthalic acid anhydride, 3,3',4,4'-diphenylsulfone tetracarboxylic acid dianhydride, and compounds of the following formulas (4)-(9).

[Chemical Formula 5]

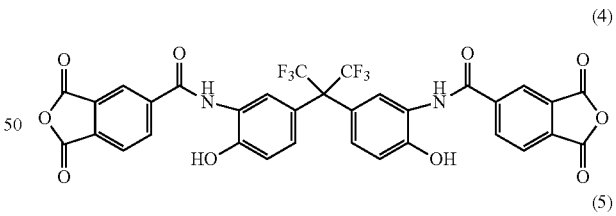

(4)

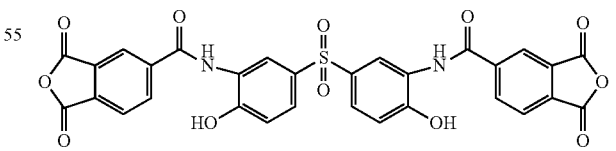

(5)

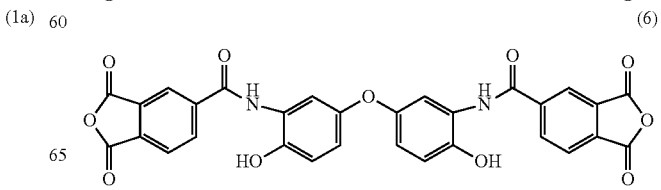

(6)

-continued (7)
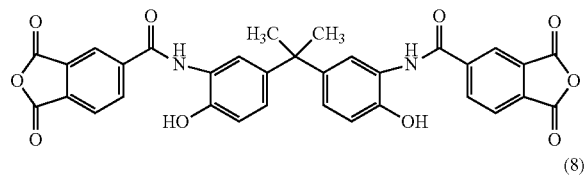

(8)
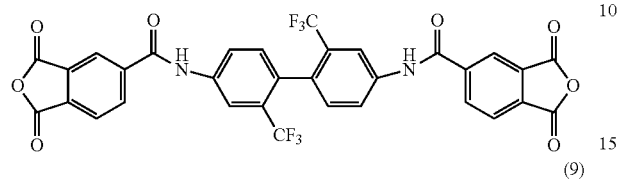

(9)
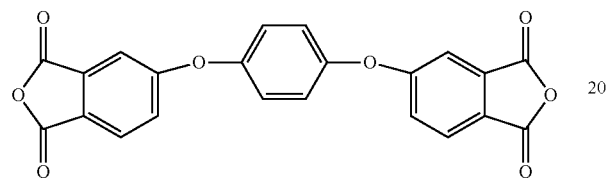

When the tetracarboxylic acid dianhydride in which two carbonyls are bonded to each of different aromatic rings or the alicyclic tetracarboxylic acid dianhydride is used, solubility and transparency of the polyimide resin tend to be improved. Among these, when 3,3',4,4'-biphenyl tetracarboxylic acid dianhydride or the acid dianhydride of the formula (8) is used, a thermal expansion coefficient tends to decrease. When 2,3,3',4'-biphenyl tetracarboxylic acid dianhydride, 4,4'-(hexafluoroisopropylidene)diphthalic acid anhydride, 3,4'-oxydiphthalic acid anhydride, 4,4'-oxydiphthalic acid anhydride, or 3,3',4,4'-diphenylsulfone tetracarboxylic acid dianhydride is used, solubility in a solvent tends to be further improved. When a polyimide using a tetracarboxylic acid dianhydride of the formulas (4)-(7) is heated to a high temperature, the polyimide is transformed to a polyimide having a polybenzoxazole ring, and heat resistance and chemical resistance and the like tend to be improved. The polyimide resin of the present invention may contain 2 or more tetracarboxylic acid dianhydride residues.

Y of the general formula (1b) is a divalent organic group having a phenolic hydroxyl group. Y preferably has a methylene group at an ortho position and/or a para position of the phenolic hydroxyl group. Examples of the divalent organic group (Y) having a methylene group at an ortho position and/or a para position of a phenolic hydroxyl group include groups represented by the following general formula group (I).

[Chemical Formula 6]

(I)
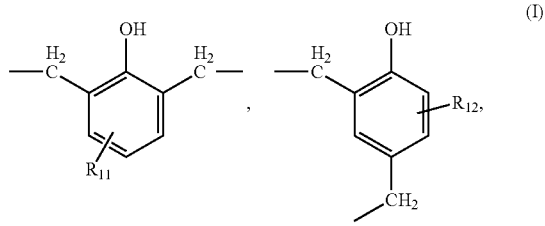

$R_{11}$ and $R_{12}$ are each independently a hydrogen atom, or an alkyl group having 1-9 carbon atoms.

Y may have 2 or more phenylenes. For example, as represented by the following general formula group (II), Y may be a group that has two phenylenes bonded to each other via a methylene and has a methylene group at an ortho position or a para position of each phenolic hydroxyl group.

[Chemical Formula 7]

(II)
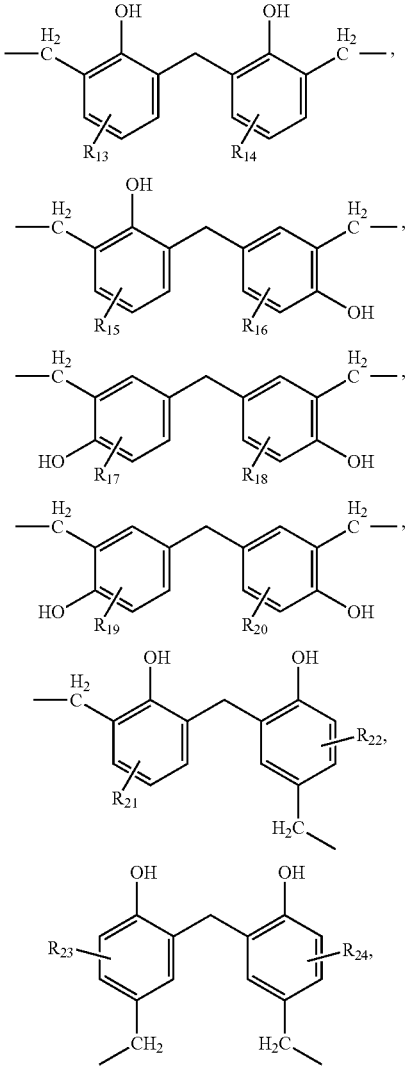

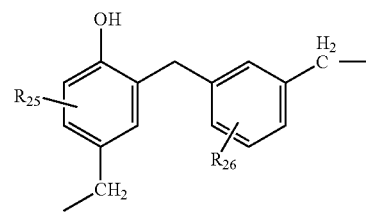

$R_{13}$-$R_{26}$ are each independently a hydrogen atom, or an alkyl group having 1-9 carbon atoms.

Specific examples of the divalent organic groups represented by the above general formula group (I) and general formula group (II) include the following organic groups.

[Chemical Formula 8]

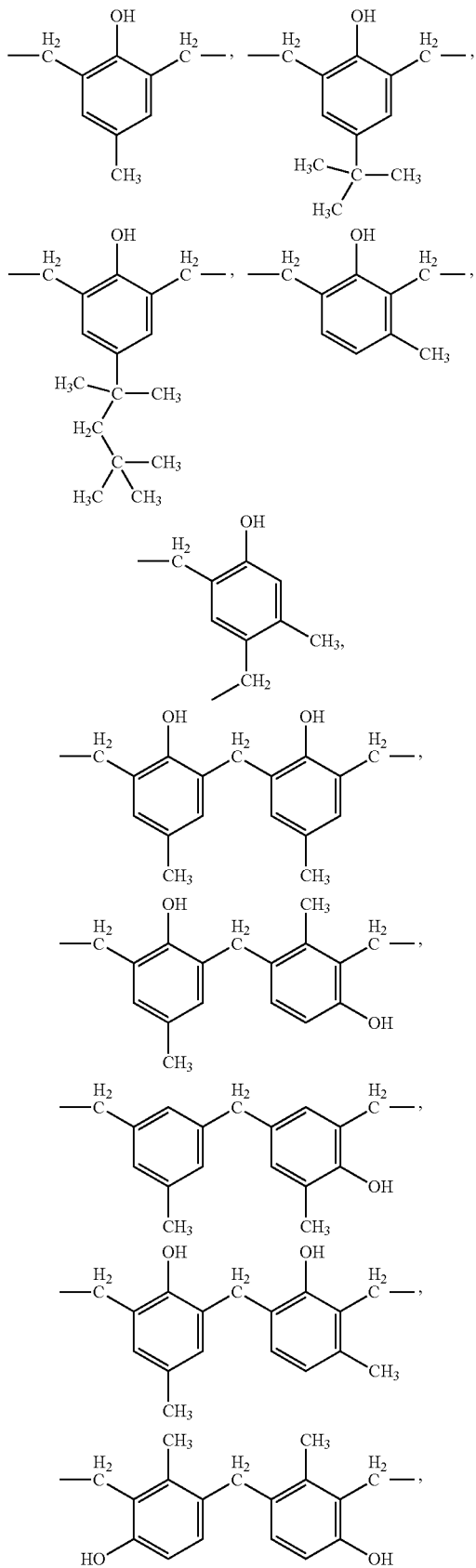

Among these, a polyimide having 2,6-dimethylene-4-methyl-phenol, 2,6-dimethylene-4-t-butyl-phenol, bis(2-hydroxy-3-methylene-5-methylphenyl) methane, or bis(4-hydroxy-5-methylene-3-methylphenyl) methane as the divalent organic group (Y) has a high solubility with respect to an organic solvent. In particular, when Y is 2,6-dimethylene-4-t-butyl-phenol, solubility in a low boiling point solvent tends to be improved.

A diamine represented by the general formula (1b) is obtained by, for example, a reaction of an aminophenol compound with a methylol compound or a methoxymethyl compound.

An example of the methylol compound is a compound in which a hydroxy group is bonded to each of the two methylenes of the above substituent group (Y). An example of the methoxymethyl compound is a compound in which a methoxy group is bonded to each of the two methylenes of the above substituent group (Y).

As the aminophenol compound, a phenol compound having an amino group at an ortho position of a hydroxyl group is used. Examples of the phenol compound having an amino group at an ortho position of a hydroxyl group include 2-aminophenol, 2-amino-3-methylphenol, 2-amino-4-methylphenol, 2-amino-5-methylphenol, 2-amino-6-methylphenol, 2-amino-3-ethylphenol, 2-amino-4-ethylphenol, 2-amino-5-ethylphenol, 2-amino-6-ethylphenol, 2-amino-3-t-butylphenol, 2-amino-4-t-butylphenol, 2-amino-6-t-butylphenol, and the like. Among these, from a point of view of reactivity, 2-aminophenol, 2-amino-4-methylphenol, 2-amino-6-t-butylphenol, and the like are preferable.

By causing 2 molar equivalents of an aminophenol compound to react with a methylol compound or a methoxymethyl compound, a diamine represented by the general formula (1b) is obtained. In order to suppress a self-condensation reaction of the methylol compound and the methoxymethyl compound, it is preferable to cause the aminophenol compound to react in an amount of 1.5 times or more in molar ratio with respect to a total amount of the methylol compound and the methoxymethyl compound. In order to improve a yield of the diamine, it is preferable to cause the aminophenol compound to react in an amount of 2-3 times in molar ratio with respect to the total amount of the methylol compound and the methoxymethyl compound.

On the other hand, by setting the amount of the aminophenol compound to be less than 2 times the total amount of the methylol compound and the methoxymethyl compound, a monofunctional amine is generated at a predetermined ratio. By allowing the diamine to contain a monofunctional amine at a predetermined ratio, a polyamide acid and a polyimide having a phenol structure at a terminal are obtained, and solubility with respect to alkali may be improved.

A reaction temperature may be set to be equal to or higher than a reaction activation temperature of the methylol compound or the methoxymethyl compound. Specifically, the reaction temperature is preferably 150° C.-250° C., and more preferably 160° C.-200° C. A solution after the reaction may be used as it is as a diamine solution for polymerization of the polyamide acid.

The polyimide resin of the present invention may contain a repeating unit other than the repeating unit represented by the general formula (1). For example, in addition to the repeating unit of the general formula (1), by containing a repeating unit represented by the following general formula (2), adhesion of the polyimide resin to a substrate tends to be improved.

[Chemical Formula 9]

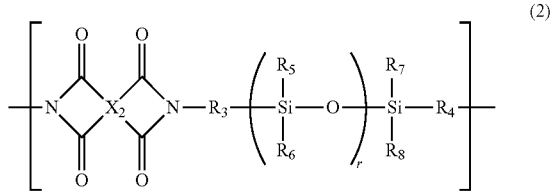

(2)

In the general formula (2), $X_2$ is a tetravalent organic group, and, similar to $X_1$ in the general formula (1), is a residue of a tetracarboxylic acid dianhydride. $R_3$ and R4 are each independently any divalent organic group, preferably an alkylene group having 1-9 carbon atoms, and particularly preferably a propylene group. $R_5$-$R_8$ are each independently an alkyl group having 1-9 carbon atoms, an alkoxy group having 1-10 carbon atoms, or a substituted or unsubstituted aryl group. r is an integer equal to or greater than 1.

A polyimide containing the structural unit of the general formula (2) is obtained by subjecting a polyamide acid to dehydration ring closure, the polyamide acid being obtained by a reaction between a tetracarboxylic acid dianhydride and a diamine containing a siloxane structure. Examples of the diamine containing a siloxane structure include 1,3-bis(3-aminopropyl)tetramethyldisiloxane, α,ω-bis(3-aminopropyl) polydimethylsiloxane, α,ω-bis(2-aminoethyl) polydimethylsiloxane, α,ω-bis(4-aminophenyl) polydimethylsiloxane, α,ω-bis(4-amino-3-methylphenyl) polydimethylsiloxane, α,ω-bis(4-aminobutyl) polydimethylsiloxane, (3-aminopropyl) polymethylphenylsiloxane, α,ω-bis(2-aminoethyl) polymethylphenylsiloxane, α,ω-bis(4-aminophenyl) polymethylphenylsiloxane, α,ω-bis(4-amino-3-methylphenyl) polymethylphenylsiloxane, α,ω-bis(4-aminobutyl) polymethylphenylsiloxane, and the like. Among these, from a point of view of improving adhesion to a substrate, 1,3-bis(3-aminopropyl)tetramethyldisiloxane and α,ω-bis(3-aminopropyl) polydimethylsiloxane are suitably used.

The polyimide resin of the present invention preferably contains the repeating unit represented by general formula (1) in an amount of 50 mol % or more. When the amount of the repeating unit represented by the general formula (1) is 50 mol % or more, the polyimide resin exhibits high solubility with respect to various organic solvents, and has excellent alkali developability when the polyimide resin is used as a positive type photosensitive resin composition. In the polyimide resin of the present invention, a total amount of the repeating unit represented by the general formula (1) and the repeating unit represented by the general formula (2) is preferably 55 mol % or more, and more preferably 60 mol % or more. The polyimide resin of the present invention preferably contains the repeating unit represented by the general formula (2) in an amount of 5 mol % or more. The content of the repeating unit represented by the general formula (1) is preferably 50-95 mol %, and the content of the repeating unit represented by the general formula (2) is preferably 5-30 mol %. When the contents are in these ranges, the polyimide resin can have heat resistance and adhesion. For the contents and content ratios of the repeating units, by adjusting a type and an amount (molar ratio) of the diamine to be used for the polymerization of the polyamide acid, a ratio of the repeating unit of the general formula (1) to the repeating unit of the general formula (2) in the polyimide resin can be set to an appropriate range.

The polyimide resin of the present invention may have any polyimide structural unit other than the repeating units represented by the general formula (1) and the general formula (2). The any polyimide structural unit is represented by the following general formula (3).

[Chemical Formula 10]

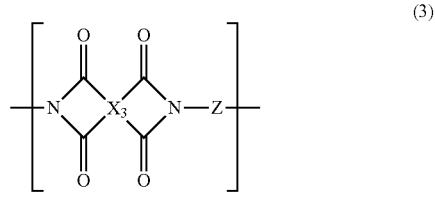

(3)

In the general formula (3), $X_3$ is a tetravalent organic group, and, similar to $X_1$ in the general formula (1), is a residue of a tetracarboxylic acid dianhydride. Z is a divalent organic group, and is a residue of a diamine. As the diamine, various diamines used in polyimide synthesis can be used without any particular limitation, and the diamine may be an aromatic compound or an alicyclic compound. In the aromatic diamine, two amino groups may be bonded to one aromatic ring (monocyclic or condensed polycyclic ring), or one amino group may be bonded to each of different aromatic rings. By using an aromatic diamine such as a p-phenylene diamine, an m-phenylene diamine or the like, heat resistance of the polyimide tends to be improved. By using a fluorine-containing diamine such as 2,2-bis[3-amino-4-hydroxyphenyl]hexafluoropropane and (3-amino-4-hydroxyphenyl) hexafluoropropane, transparency and water repellency of a coating film can be controlled.

In the polyimide resin of the present invention, a content of the repeating unit represented by general formula (3) is preferably 0-40 mol %.

(Polyamide Acid)

By causing an acid dianhydride and a diamine at substantially equimolar amounts to react in an organic solvent, a polyamide acid is obtained. The organic solvent used for the synthesis reaction of the polyamide acid is preferably a polar solvent. Examples of organic polar solvents include sulfoxide-based solvents such as dimethyl sulfoxide and diethyl sulfoxide; formamide-based solvents such as N,N-dimethylformamide and N,N-diethylformamide; acetamide-based solvents such as N,N-dimethylacetamide and N,N-diethylacetamide; pyrrolidone-based solvents such as N-methyl-2-pyrrolidone and N-vinyl-2-pyrrolidone; phenol-based solvents such as phenol, o-cresol, m-cresol, p-cresol, xylenol, halogenated phenol and catechol; hexamethylphosphoramide; γ-butyrolactone; and the like. When necessary, these organic polar solvents and aromatic hydrocarbons such as xylene and toluene can be used in combination.

An order of adding the monomers is not particularly limited. For example, a diamine may be added to a solution obtained by dissolving a tetracarboxylic acid dianhydride in an organic polar solvent, or a tetracarboxylic acid dianhydride may be added to a solution obtained by dissolving a diamine component in an organic polar solvent. A tetracarboxylic acid dianhydride and, when necessary, another diamine may be added to a solution of a diamine represented by the general formula (1b). For a purpose of controlling a molecular weight or the like, it is also possible that a prepolymer is formed by causing a reaction to occur between the tetracarboxylic acid dianhydride and the diamine with one of tetracarboxylic acid dianhydride and the diamine in an excess amount, and post polymerization is performed by adding a remaining monomer so as to be in an equimolar amount to the tetracarboxylic acid dianhydride. Here, the term "dissolving" includes a case where a solvent completely dissolves a solute, as well as a case where a solute is in a state similar to being uniformly dispersed and substantially dissolved in a solvent. A reaction time and a reaction temperature in the polymerization of the polyamide acid are not particularly limited.

From a point of view of achieving both a good film strength and a good solubility in an organic solvent, a weight-average molecular weight of the polyimide resin of the present invention is preferably 3,000-150,000, more preferably 5,000-50,000, and even more preferably 6,000-35,000. In order to control the weight-average molecular weight of the polyimide to be within this range, it is desirable to control a molecular weight of the polyamide acid by adjusting a ratio of the tetracarboxylic acid dianhydride to the diamine. More specifically, (a total molar amount of the tetracarboxylic acid dianhydride)/(a total molar amount of the diamine) is desirably in a range of 0.80-1.20. By using a monofunctional amine and/or an acid anhydride as end capping components, excessive increase in molecular weight can be suppressed.

(Imidization)

A polyimide is obtained by dehydration ring closure of a polyamide acid. An imidization reaction is desirably performed in a solution in which the polyamide acid is dissolved. Examples of methods for imidizing a polyamide acid in a solution include a thermal imidization method in which dehydration ring closure is performed by heating, and a chemical imidization method in which a dehydrating agent and a catalyst are used.

As a thermal imidization method, it is desirable to mix xylene or toluene as an azeotropic solvent into the polyamide acid solution and to perform imidization by heating the solution while discharging water. In order to for the imidization to proceed efficiently, a heating temperature is preferably 120-250° C., and more preferably 150-200° C.

Examples of the dehydrating agent used in the chemical imidization method include an aliphatic acid dianhydride such as an acetic anhydride, and an aromatic acid dianhydride. Examples of the catalyst include aliphatic tertiary amines such as triethylamine; aromatic tertiary amines such as dimethylaniline; heterocyclic tertiary amines such as pyridine, isoquinoline, β-picoline, γ-picoline, and lutidine; and the like. An additive amount of the dehydrating agent and the catalyst with respect to the polyamide acid is preferably 0.01-10 molar equivalents and more preferably 0.5-5 molar equivalents with respect to an amide group of the polyamide acid. In chemical imidization, in order to promote the imidization reaction, the polyamide acid solution to which the dehydrating agent and the catalyst are added may also be heated. A heating temperature is preferably 200° C. or lower, and more preferably 150° C. or lower.

(Extraction of Polyimide Resin)

A method for extracting a polyimide resin from a solution is not particularly limited. For example, a polyimide resin may be precipitated by mixing a polyimide solution with a poor solvent. For mixing a polyimide solution with a poor solvent, either a method of charging the polyimide solution into the poor solvent or a method of charging the poor solvent into the polyimide resin solution may be used. The poor solvent is a poor solvent of a polyimide. Any poor solvent can be used as long as the poor solvent is miscible with the solvent of the polyimide resin. Examples of the poor solvent include water; alcohols such as methyl alcohol, ethyl alcohol, and isopropyl alcohol; polyols such as ethylene glycol and triethylene glycol; and the like.

By mixing the polyimide solution and the poor solvent while stirring the mixture, a solid polyimide resin is obtained. In order to obtain a flaky polyimide resin, it is preferable to perform extraction with a poor solvent in an amount of three or more times an amount of the polyimide solution. The obtained solid polyimide resin is preferably washed by Soxhlet washing or the like. The washed polyimide resin is preferably dried by vacuum drying, hot air drying or the like. A drying temperature is desirably lower than a glass transition temperature of the polyimide resin and higher than boiling points of the solvent, the catalyst and the dehydrating agent.

[Resin Composition]

The polyimide resin of the present invention has a phenol structure derived from a diamine represented by the general formula (1b). This structure has, in one repeating unit, phenolic hydroxyl groups respectively on two phenylenes bonded to nitrogen atoms of imides and on at least one phenylene bonded to the two phenylenes, and thus has a high density of hydroxyl groups. The hydroxyl groups have an effect of imparting solubility with respect to various organic solvents. Therefore, the polyimide resin of the present invention exhibits a high solubility even with respect to a low boiling point solvent and is suitably used for forming an insulating film on various substrate surfaces.

A phenolic hydroxyl group derived from a diamine represented by the general formula (1b) becomes a reaction point (crosslinking point) with a thermosetting compound such as methylol or epoxy. Therefore, a thermosetting resin composition containing the polyimide resin of the present invention has a high crosslinking density and an excellent durability. Further, a phenolic hydroxyl group derived from a diamine represented by the general formula (1b) also has an effect of imparting alkali solubility to the polyimide resin. Therefore, a resin composition containing the polyimide resin of the present invention is also suitably used for an alkali-soluble resist material and the like.

<Thermosetting Resin Composition>

A resin composition of the present invention contains the above polyimide resin as a component (A) and a thermosetting compound as a component (B).

(B: Thermosetting Compound)

The thermosetting compound as the component (B) is not particularly limited as long as the thermosetting compound can introduce a crosslinked structure into the component (A) by heat. For example, thermosetting compounds such as an epoxy compound, a methylol compound, a methoxymethyl compound, a bismaleimide compound, a bisallylnadiimide compound, a hydrosilyl compound, an allyl compound, and an unsaturated polyester compound; a side chain reactive group type thermosetting polymer having a reactive group such as an allyl group, a vinyl group, an alkoxysilyl group, a hydrosilyl group or the like at a side chain or a terminal of a polymer chain; and the like can be used. Two or more of these thermosetting compounds may be appropriately combined and used.

Among these thermosetting compounds, from a point of view of having an excellent reactivity with phenolic hydroxyl groups of a polyimide, the epoxy compound, the methylol compound, the methoxymethyl compound and the like are preferably used. Thermosetting films of a polyimide and these thermosetting compounds exhibit good adhesion to conductors such as metal foils and circuit substrates and have high heat resistance.

The epoxy compound preferably has two or more glycidyl groups in one molecule, and examples of the epoxy compound include epoxy compounds such as a bisphenol-type epoxy compound, a bisphenol A novolak type epoxy compound, a biphenyl type epoxy compound, a phenol novolak type epoxy compound, an alkylphenol novolac type epoxy compound, a polyglycol type epoxy compound, a cyclic aliphatic epoxy compound, a cresol novolak type epoxy compound, a glycidyl amine type epoxy compound, a naphthalene type epoxy compound, an urethane modified epoxy compound, a rubber modified epoxy compound, and an epoxy modified polysiloxane.

As the methylol compound, a compound in which two or more methylol groups are bonded to a central skeleton is preferable, and examples of such a compound include 2,6-dihydroxymethyl-4-methylphenol, 2,4-dihydroxymethyl-6-methylphenol, 2,6-dihydroxymethyl-4-t-butylphenol, 2,4-dihydroxymethyl-4-t-butylphenol, bis(2-hydroxy-3-hydroxymethyl-5-methylphenyl) methane, and bis(4-hydroxy-3-hydroxymethyl-5-methylphenyl) methane.

As the methoxymethyl compound, a compound in which two or more methoxymethyl groups are bonded to a central skeleton is preferable, and examples of such a compound include 2,6-dimethoxymethyl-4-methylphenol, 2,4-dimethoxymethyl-6-methylphenol, 2,6-dimethoxymethyl-4-t-butylphenol, 2,4-dimethoxymethyl-4-t-butylphenol, bis(2-methoxy-3-hydroxymethyl-5-methylphenyl) methane, and bis(4-methoxy-3-hydroxymethyl-5-methylphenyl) methane.

A thermosetting resin composition preferably contains 5-400 parts by weight of the thermosetting compound (B) with respect to 100 parts by weight of the polyimide resin (A). A weight ratio (A)/(B) of the component (A) to the component (B) is more preferably 20/80-95/5. When the weight ratio is within this range, a thermosetting film having high toughness and excellent flexibility can be obtained.

(Solvent)

The thermosetting resin composition of the present invention preferably contains a solvent in addition to the above-described component (A) and component (B). The solvent is not particularly limited as long as the solvent can dissolve the component (A) and the component (B), and, for example, the above-described organic solvent or the like as a solvent for the polymerization of the polyamide acid is used.

<Positive Type Photosensitive Resin Composition>

(C: Positive Type Photosensitizer)

A positive type photosensitive resin composition is obtained by containing a positive type photosensitizer as a component (C) in addition to the above-described polyimide resin (A) and thermosetting compound (B) and solvent. A positive type photosensitive resin composition preferably contains 15-100 parts by weight of the positive type photosensitizer (C) with respect to 100 parts by weight of the polyimide resin (A). Two or more positive type photosensitizers may be used.

A positive type photosensitizer as the component (C) is a compound (photoacid generator) that generates an acid by irradiation with light, and a photosensitizer used for a positive type resist such as a sulfonium salt, a phosphonium salt, a diazonium salt, a quinone diazide compound or the like can be used without particular limitation. Among these, from a point of view of having excellent dispersibility and compatibility with respect to the polyimide resin as the component (A) and allowing a pattern with a high resolution to be formed, a quinone diazide compound is preferable.

Examples of the quinone diazide compound include an ester of a polyhydroxy compound and quinone diazide, an amide of a polyamino compound and quinone diazide, an ester bond and/or amide of a polyhydroxy polyamino compound and quinone diazide, and the like. In these polyhydroxy compound and polyamino compound, 50 mol % or more in total of hydroxy groups and amino groups are preferably substituted with quinone diazide. The quinonediazide compound is particularly preferably a naphthoquinone diazide having any one of a 5-naphthoquinonediazide sulfonyl group and a 4-naphthoquinonediazide sulfonyl group.

(D: Novolak Resin)

The positive type photosensitive resin composition preferably contains a novolak resin as a component (D). By containing a novolak resin, optical sensitivity and contrast can be improved, and resolution of a pattern can be increased. From a point of view of improving developability, a content of the novolak resin (D) with respect to 100 parts by weight of the polyimide resin (A) is preferably 500 parts by weight or less, and more preferably 5-400 parts by weight. Two or more novolak resins may be used.

As the novolak resin, a novolak resin used for a general positive type photosensitive resin composition can be used without any particular limitation. A novolak resin is obtained by polycondensation of phenols and aldehydes. Examples of the phenols include phenol, o-cresol, m-cresol, p-cresol, 2,3-xylenol, 2,5-xylenol, 3,4-xylenol, 3,5-xylenol, 2,3,5-trimethyl phenol, 3,4,5-trimethyl phenol and the like. Examples of the aldehydes include formaldehyde, paraformaldehyde, acetaldehyde, benzaldehyde, hydroxybenzaldehyde, chloroacetaldehyde and the like. An amount of the aldehydes to be used with respect to 1 mol of the phenols is preferably 0.6 mol or more, and more preferably 0.7 mol or more. An average molecular weight of the novolak resin is preferably 1,000-20,000, and more preferably 1,500-15,000.

For a general novolak resin, a melting point is 100-150° C., and heat resistance is not sufficient. The positive type photosensitive resin composition of the present invention contains the polyimide (A) and the thermosetting compound (B), and has high heat resistance by performing thermal curing after development. The polyimide (A) has a phenolic hydroxyl group, and thus exhibits a high solubility with respect to an alkali liquid developer and is excellent in compatibility and dispersibility with respect to the positive type photosensitizer (C) and the novolak resin (D). Therefore, the positive type photosensitive resin composition of the present invention can achieve the same high resolution as a positive type photosensitive resin composition using a novolak resin alone.

<Other Components Contained in Resin Composition>

When necessary, the resin composition of the present invention may contain various additives such as an organic or inorganic filler, a surfactant, a defoaming agent, a leveling agent, a stabilizer, an antioxidant, and a silane coupling agent; and may contain a curing agent, a curing accelerator, a catalyst and the like of the thermosetting compound. In addition to the above, the photosensitive resin composition may contain a development aid.

(Curing Agent, Curing Accelerator, Curing Catalyst)

Examples of a curing agent of an epoxy compound include phenol resins, acid anhydrides, amino resins, urea resins, melamine resins, dicyandiamide, dihydrazine compounds, imidazole compounds, polymercaptan compounds, isocyanates, and the like. A curing agent is preferably used within a range of 1-100 parts by weight with respect to 100 parts by weight of an epoxy resin. Examples of a curing accelerator of an epoxy compound include phosphine-based compounds, amine-based compounds, borate-based compounds, imidazoles, imidazolines, and the like. A curing accelerator is preferably used within a range of 0.01-10 parts by weight with respect to a total amount of 100 parts by weight of the polyimide resin (A) and an epoxy compound as the component (B).

As a curing catalyst of a methylol compound, an acid catalyst such as an oxalic acid, a p-toluenesulfonic acid, a sulfuric acid, a hydrochloric acid, a nitric acid or the like is used.

(Silane Coupling Agent)

Examples of a silane coupling agent include coupling agents having an epoxy group, an oxetanyl group, a methacryloxy group, an acryloxy group, an amino group, an amide group or a mercapto group, and an alkoxysilyl group. Among these, when a silane coupling agent containing an epoxy group, a mercapto group or an oxetanyl group is used, reactivity with the polyimide resin (A) and the thermosetting compound (B) tends to be high, and adhesion between a cured film and a substrate tends to be improved. A content of the silane coupling agent in the resin composition is preferably 0.01-30 parts by weight, and more preferably 0.1-15 parts by weight, with respect to 100 parts by weight of the polyimide resin (A).

(Development Aid)

An example of a development aid of a positive type photosensitive resin composition is a compound having a phenolic hydroxyl group. Examples of a compound having a phenolic hydroxyl group include biphenol, metacresol, paracresol, ortho-cresol, 4M2B, 3M6B, 2,3,5-trimethylphenol, 2,3,6-trimethylphenol, xylenol, bisphenol A, bisphenol AP, bisphenol AF, bisphenol B, bisphenol BP, bisphenol C, bisphenol E, bisphenol F, bisphenol G, bisphenol M, bisphenol S, bisphenol P, bisphenol PH, bisphenol TMC, bisphenol Z, Bis-Z, TekP-4HBPA, TrisP-HAP, TrisP-PA, BisRS-2P, BisRS-3P, BisP-AP, BisP-TMC, BIR-PC, BIR-PTBP, BIR-BIPC-F and the like. A content of the development aid in the photosensitive resin composition is preferably 3-40 parts by weight with respect to 100 parts by weight of the polyimide resin (A).

[Mode of Use of the Resin Composition]

By dissolving the above components in a solvent, a resin composition (solution) of the present invention is obtained. By applying the resin solution on a substrate, drying the solvent, and heating and curing the resulting coating film, a cured film is formed. Examples of a coating method include spin coating, spray coating, roll coating, die coating and the like. A coating film thickness is usually set such that a film thickness after drying is 0.1-150 µm. The drying of the solvent is preferably performed at a temperature of about 50-150° C. for about 1 minute-2 hours using an oven, a hot plate, infrared light and the like. The heating and curing after the drying are preferably performed at a temperature of about 150-300° C. for about 5 minutes-5 hours. The cured film can be suitably used as an insulating protective material on a circuit surface of an electronic material such as a coating formation material for covering a silicon wafer, a glass substrate, or a substrate of a printed circuit board.

With respect to the photosensitive resin composition containing a positive type photosensitizer, a resin solution is applied on a substrate and a solvent is dried to form a coating film, and thereafter, patterning by exposure and development is performed. The exposure is performed by irradiating actinic light through a photomask having a predetermined pattern on the coating film of the photosensitive resin composition. As the actinic light, ultraviolet light, visible light, electron beam, X ray or the like is used. In particular, i ray (365 nm), h ray (405 nm), g ray (436 nm) and the like of a mercury lamp are preferably used.

After the exposure, a pattern is formed by dissolving and removing the resin composition film in exposed regions using a liquid developer. As the liquid developer, an alkaline aqueous solution such as tetramethylammonium, diethanolamine, di ethyl aminoethanol, sodium hydroxide, potassium hydroxide, sodium carbonate, potassium carbonate or the like is used. In the exposed regions, a dissolution rate in an alkaline aqueous solution is improved by an acid generated from a photosensitizer (photo acid generator). Since the polyimide resin (A) has a phenolic hydroxyl group, the polyimide resin also exhibits alkali solubility in the exposed regions. By heating after the development and thermally curing the coating film remaining in unexposed regions, heat resistance and solvent resistance are improved.

EXAMPLES

In the following, the present invention is described in detail based on examples. However, the present invention is not limited by these examples.

The weight-average molecular weight of the polyimide resin was measured under the following conditions.

Equipment used: Tosoh GPC-8020
Column: Shodex GPC KD-802M manufactured by Showa Denko KK (inner diameter 8 mm×300 mm)×2
Eluent: 30 mM LiBr+20 mM $H_3PO_4$/DMF
Flow rate: 0.6 mL/min
Column temperature: 40° C.
Detector: Tosoh RI-8020
Sample concentration: 0.4 weight %
Injection volume: 30 µL
Reference material: polyethylene oxide Synthesis Example 1

(Synthesis of Phenol Structure-Containing Diamine)

13.3 g (122 mmol) of 2-aminophenol was dissolved in 12.1 g of N-methyl-2-pyrrolidone (NMP) in a 300 ml separable flask, and further, 14.6 g (61.1 mmol) of 2,6-bis (methoxymethyl)-4-t-butylphenol and 0.219 g (2.43 mmol) of oxalic acid were added and dissolved, and the mixture was allowed to react at 170° C. for 5 hours. Methanol generated by the reaction was trapped and progress of the reaction was monitored from an amount of the methanol generated. After confirming that all 2,6-bis(methoxymethyl)-4-t-butylphenol had reacted, the reaction container was cooled to a room temperature. Subsequently, 82.2 g of NMP was added to dilute the reaction solution.

(Polymerization and Imidization of Polyamide Acid)

1.77 g (6.79 mmol) of 1,3-bis(3-aminopropyl)tetramethyldisiloxane and 21.1 g (67.9 mmol) of 4,4'-oxydiphthalic acid anhydride were added to the above phenol structure-containing diamine solution, and the mixture was stirred at a room temperature for 3 hours to obtain a polyamide acid solution. 10 g of toluene was added to the polyamide acid solution, and the mixture was heated to 180° C., and an imidization reaction was performed for 5 hours while generated water was discharged. The reaction was terminated after confirming that the generation of water had completely finished. The obtained polyimide solution was poured into 2 liters of water and was precipitated. After repeating filtration and washing with water three times, vacuum drying in a vacuum oven heated to 80° C. was performed for 72 hours to remove water and a solvent, and a flaky polyimide resin (weight-average molecular weight: 31000) was obtained.

Synthesis Example 2

A phenol structure-containing diamine (108 mmol) was synthesized in the same manner as in Synthesis Example 1 by changing a reaction scale by 1.7 times using a 500 ml separable flask. 3.11 g (12 mmol) of 1,3-bis(3-aminopropyl)tetramethyldisiloxane, 17.60 g (60 mmol) of 3,3',4,4'-biphenyl tetracarboxylic acid dianhydride, and 18.56 g (60 mmol) of 4,4'-oxydiphthalic anhydride were added to a phenol structure-containing diamine solution, and the mixture was stirred at a room temperature for 3 hours to obtain a polyamide acid solution. Thereafter, similar to Synthesis Example 1, imidization, precipitation in water, washing with water and drying were performed to obtain a flaky polyimide resin (weight-average molecular weight: 11,400).

Synthesis Example 3

(Synthesis of Phenol Structure-Containing Diamine)

21.17 g (194 mmol) of 2-aminophenol was dissolved in 153.5 g of NMP in a 500 ml separable flask, and further, 26.494 g (91.9 mmol) of bis(2-hydroxy-3-hydroxymethyl-5-methylphenyl) methane and 1.590 g (17.67 mmol) of oxalic acid were added and dissolved, and the mixture was allowed to react at 170° C. for 5 hours. Water generated by the reaction was trapped and progress of the reaction was monitored from an amount of the water generated. After confirming that all bis(2-hydroxy-3-hydroxymethyl-5-methylphenyl) methane had reacted, the reaction container was cooled to a room temperature.

(Polymerization and Imidization of Polyamide Acid)

1.33 g (5.10 mmol) of 1,3-bis(3-aminopropyl)tetramethyldisiloxane, 15.84 g (51 mmol) of 4,4'-oxydiphthalic acid anhydride, and 22.68 g (51 mmol) of 4,4'-(hexafluoroisopropylidene)diphthalic acid anhydride were added to the above phenol structure-containing diamine solution, and the mixture was stirred at a room temperature for 3 hours to obtain a polyamide acid solution. Thereafter, similar to Synthesis Example 1, imidization, precipitation in water, washing with water and drying were performed to obtain a flaky polyimide resin (weight-average molecular weight: 10,300).

Comparative Synthesis Example 1

24.9 g (96.3 mmol) of 2,2-bis(3-amino-4-hydroxyphenyl) propane, 1.47 g (5.7 mmol) of 1,3-bis(3-aminopropyl)tetramethyldisiloxane, and 2.47 g (22.7 mmol) of 3-aminophenol were dissolved in 96.0 g of NMP in a 500 ml separable flask, and 35.2 g (113 mmol) of 4,4'-oxydiphthalic acid anhydride was added, and the mixture was stirred at room temperature for 3 hours to obtain a polyamide acid solution. Thereafter, similar to Synthesis Example 1, imidization, precipitation in water, washing with water and drying were performed to obtain a flaky polyimide resin (weight-average molecular weight: 11,900).

Comparative Synthesis Example 2

24.92 g (52.7 mmol) of 2,2'-methylenebis [4-methyl-6-(3,5-dimethyl-4-aminobenzyl) phenol] was dissolved in 58.0 g of NMP in a 500 ml separable flask, and 0.722 g (2.8 mmol) of 1,3-bis(3-aminopropyl)tetramethyldisiloxane and 16.36 g (52.7 mmol) of 4,4'-oxydiphthalic anhydride were added, and the mixture was stirred at a room temperature for 3 hours to obtain a polyamide acid solution. Thereafter, similar to Synthesis Example 1, imidization, precipitation in water, washing with water and drying were performed to obtain a flaky polyimide resin (weight-average molecular weight: 41,000).

[Evaluation of Solubility of Polyimide Resin]

The polyimide resins obtained in Synthesis Examples and Comparative Synthesis Examples were respectively added to γ-butyl lactone (GBL), propylene glycol-1-monomethyl ether-2-acetate (PGMEA) and NMP such that a solid content concentration became 30%, and the mixtures were stirred at a room temperature, and solubilities were visually observed. After allowing the solutions to stand at a room temperature for 24 hours, the solubilities were visually observed again. Evaluation results are shown in Table 1. In Table 1, samples in which the polyimide was completely dissolved and precipitation or gelation did not occur even after standing for 24 hours were indicated using "A;" samples in which the polyimide was insoluble in the solvent were indicated using "X;" and other samples were indicated using "B."

TABLE 1

|  | GBL | PGMEA | NMP |
| --- | --- | --- | --- |
| Synthesis Example 1 | A | A | A |
| Synthesis Example 2 | A | A | A |
| Synthesis Example 3 | A | A | A |
| Comparative Synthesis Example 1 | B | X | A |
| Comparative Synthesis Example 2 | A | B | A |

The polyimide resins of Synthesis Examples 1-3 dissolved in all of GBL, PGMEA and NMP, and no insoluble components remained. The polyimide resin of Comparative Synthesis Example 1 was soluble in GBL and NMP, but was insoluble in PGMEA. The GBL solution of the polyimide resin of Comparative Synthesis Example 1 gelled after standing for 24 hours at a room temperature. The polyimide resin of Comparative Synthesis Example 2 dissolved in NMP and GBL, but had a poor solubility in PGMEA.

[Preparation and Evaluation of Thermosetting Resin Composition]

Example 1

10 g of the polyimide resin of Synthesis Example 1, 5 g of 4,5-dimethoxy-1,3-bis(methoxymethyl) imidazolidin-2-one ("Nicarac MX-280" manufactured by Sanwa Chemical)

and 0.1 g of oxalic acid were dissolved in 35 g of PGMEA to prepare a resin composition (solution). This solution was applied to a surface of a glass plate such that a dry thickness was 10 μm, and heating from a room temperature to 250° C. was performed in an oven under a nitrogen atmosphere to perform drying of the solvent and curing.

Example 2 and Example 3

Instead of the polyimide resin of Synthesis Example 1, the polyimide resins of Synthesis Example 2 and Synthesis Example 3 were used to prepared resin compositions and to perform formation of coating films, drying and curing in the same manner as in Example 1.

The cured films of Examples 1-3 were all good films with no cracks. No occurrence of cracks was observed even after standing for 300 hours in an environmental test apparatus at 121° C. and 100% RH, indicating good durability. The polyimide resins of Comparative Synthesis Example 1 and Comparative Synthesis Example 2 had poor solubility with respect to PGMEA, and thus, preparation and evaluation of resin compositions were not performed.

[Preparation and Evaluation of Positive Type Photosensitive Resin Composition]

Example 4

100 parts by weight of the polyimide resin of Synthesis Example 1, 45 parts by weight of a photosensitizer having a 5-naphthoquinone diazide sulfonyl group ("TPA 30" manufactured by Toyo Gosei Co., Ltd.), 12 parts by weight of 2,6-bis(methoxymethyl)-4-[3,5-bis(methoxymethyl)-4-hydroxyphenyl]phenol and 20 parts by weight of 4,5-dimethoxy-1,3-bis(methoxymethyl) imidazolidin-2-one ("Nikalac MX-280" manufactured by Sanwa Chemical Co., Ltd.) as thermosetting compounds, 125 parts by weight of a novolak resin ("TR6050G" manufactured by Asahi Organic Materials), 12 parts by weight of a development aid ("TrisP-PHBA-s" manufactured by Honshu Chemical Co., Ltd.), and 1 part by weight of a silane coupling agent (3-mercaptopropyltrimethoxysilane) were dissolved in 470 parts by weight of GBA to prepare a photosensitive resin composition.

Example 5

100 parts by weight of the polyimide resin of Synthesis Example 2, 25 parts by weight of a photosensitizer (TPA30), 25 parts by weight of an ester compound of bis[3-(4-hydroxybenzyl)-4-hydroxy-2,5-dimethylphenyl]methane and 5-naphthoquinonediazidosulfonic acid ("CNB-300" manufactured by Toyo Gosei Industry Co., Ltd.), 12 parts by weight of TMOM-BP and 23 parts by weight of tetrabutoxymethyl glycoluril ("Nikalac MX-279" manufactured by Sanwa Chemical Co., Ltd.) as thermosetting compounds, 78 parts by weight of TR6050G, 45 parts by weight of TR4020G, 12 parts by weight of TrisP-PHBA-s, and 1 part by weight of 3-mercaptopropyltrimethoxysilane, were dissolved in 510 parts by weight of GBL to prepare a photosensitive resin composition.

Comparative Example 1

A photosensitive resin composition was prepared in the same manner as in Example 5 except that the polyimide resin of Comparative Synthesis Example 2 was used in an amount of 100 parts by weight instead of the polyimide resin of Synthesis Example 2.

<Exposure and Development>

The photosensitive resin compositions of Examples 4-6 and Comparative Example 1 were each applied on a 6-inch silicon wafer using a spin coater (MS-A150 manufactured by MIKASA) such that a final thickness became 6 μm, and preliminary drying was performed on a hot plate at 115° C. for 3 minutes. Thereafter, exposure was performed by irradiating the coating film with ultraviolet light at an accumulated light amount of 300 mJ/cm$^2$ via a pattern mask, and development was performed using a 2.38 wt % tetramethylammonium hydroxide (TMAH) aqueous solution in an environment of 25° C.

For each of Examples 4 and 5 and Comparative Example 1, optical microscope observation of a plane of a silicon wafer and observation of a shape of a pattern area having line/space=(10 μm)/(10 μm) using a laser microscope after development of a photosensitive resin composition were performed. An optical microscope observation image and a cross-sectional shape of Example 4 are shown in FIG. 1; an optical microscope observation image and a cross-sectional shape of Example 5 are shown in FIG. 2; and an optical microscope observation image and a cross-sectional shape of Comparative Example 1 are shown in FIG. 3.

In each Examples 4 and 5, a residual film rate of the pattern after development was 100%, and the pattern shape was also good. On the other hand, in Comparative Example 1, a boundary between an exposed portion and a non-exposed portion was unclear, and a pattern defect occurred. From these results, it is clear that in each of Examples 4 and 5, an alkali solubilization mechanism due to a photosensitizer works properly and the polyimide resin exhibits a proper alkali solubility, and thus, a fine pattern by alkali development can be formed.

What is claimed is:

1. A polyimide resin comprising a repeating unit represented by the following formula (1) and a repeating unit represented by the following formula (2):

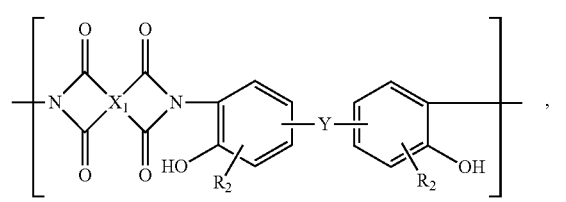

(1)

wherein $X_1$ is a tetravalent organic group comprising at least one ring structure, and each two of four carbonyl groups bonded to $X_1$ form a pair and, together with $X_1$ and a nitrogen atom, form a five-membered ring, $R_2$ is a hydrogen, an alkyl group having 1 to 9 carbon atoms, or an alkoxy group comprising 1 to 10 carbon atoms, and Y is a divalent organic group selected from the group consisting of 2,6-dimethylene-4-methyl-phenol; 2,6-dimethylene-4-t-butyl-phenol; bis(2-hydroxy-3-methylene-5-methylphenyl) methane; and bis(4-hydroxy-5-methylene-3-methylphenyl) methane,

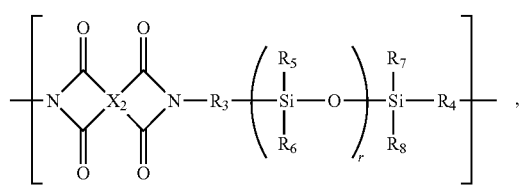
(2)

wherein $X_2$ is a tetravalent organic group comprising at least one ring structure, and each two of four carbonyl groups bonded to $X_2$ form a pair and, together with $X_2$ and a nitrogen atom, form a five-membered ring, $R_3$ and $R_4$ are each independently a divalent organic group, $R_5$-$R_8$ are each independently an alkyl group comprising 1 to 9 carbon atoms, an alkoxy group comprising 1 to 10 carbon atoms, or a substituted or unsubstituted aryl group, and r is an integer equal to or greater than 1.

2. The polyimide resin according to claim 1, wherein the $R_3$ and the $R_4$ in the formula (2) are each independently an alkylene group comprising 1 to 9 carbon atoms.

3. The polyimide resin according to claim 1, wherein the polyimide resin comprises the repeating unit represented by the formula (1) in an amount of from 50 to 95 mol %, and a total amount of the repeating unit represented by the formula (1) and the repeating unit represented by the formula (2) is from 55 to 100 mol %.

4. The polyimide resin according to claim 1, wherein the polyimide resin has a weight-average molecular weight of from 3,000 to 150,000.

5. The polyimide resin according to claim 1, further comprising a polyimide structural unit represented by the following formula (3):

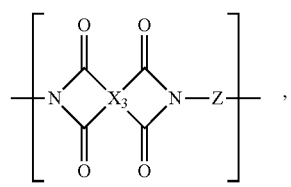
(3)

wherein $X_3$ is a tetravalent organic group, and Z is a divalent organic group.

6. The polyimide resin according to claim 5, wherein the polyimide resin comprises 40 mol % or less of the repeating unit represented by the formula (3).

7. The polyimide resin according to claim 1, wherein the polyimide resin has a weight-average molecular weight of from 6,000 to 35,000.

* * * * *